United States Patent
Suh et al.

(10) Patent No.: US 8,095,806 B2
(45) Date of Patent: Jan. 10, 2012

(54) METHOD OF POWER SIMULATION AND POWER SIMULATOR

(75) Inventors: Dong Kwan Suh, Uiwang-si (KR); Soojung Ryu, Cheonan-si (KR); Dong-Hoon Yoo, Suwon-si (KR); Il Hyun Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 978 days.

(21) Appl. No.: 12/024,694

(22) Filed: Feb. 1, 2008

(65) Prior Publication Data
US 2009/0077357 A1    Mar. 19, 2009

(30) Foreign Application Priority Data

Sep. 14, 2007 (KR) .................... 10-2007-0093663

(51) Int. Cl.
*G06F 1/26* (2006.01)
*G06F 1/32* (2006.01)

(52) U.S. Cl. ......... 713/300; 713/320; 713/340; 716/109
(58) Field of Classification Search .................. 713/300, 713/320, 340; 716/109
See application file for complete search history.

(56) References Cited

U.S. PATENT DOCUMENTS

| | | | |
|---|---|---|---|
| 7,073,159 B2 * | 7/2006 | Tsai et al. | 716/112 |
| 7,580,914 B2 * | 8/2009 | Wang et al. | 1/1 |
| 2005/0034089 A1 * | 2/2005 | McGuffin et al. | 716/5 |
| 2006/0277509 A1 * | 12/2006 | Tung et al. | 716/5 |

* cited by examiner

*Primary Examiner* — Thomas Lee
*Assistant Examiner* — Michael J Brown
(74) *Attorney, Agent, or Firm* — NSIP Law

(57) ABSTRACT

Disclosed are a method of simulating power and a power simulator. The power simulator includes a static information extracting unit that extracts static information with respect to execution of the second instruction; a dynamic information extracting unit that extracts dynamic information with respect to the execution of the second instruction; and a calculation unit that calculates an estimated power of the processor based on the static information and the dynamic information.

18 Claims, 10 Drawing Sheets

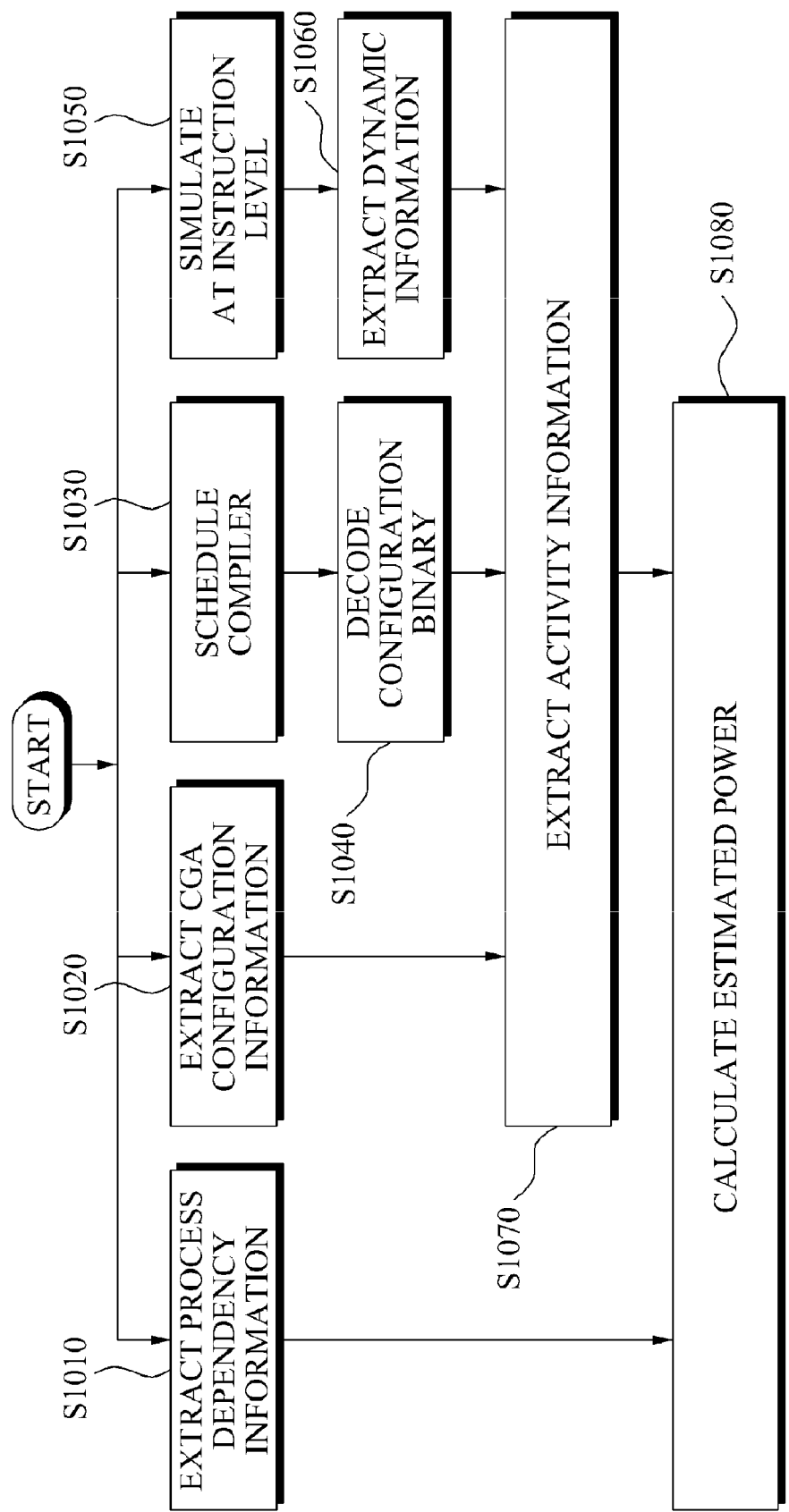

METHOD OF POWER SIMULATION AND POWER SIMULATOR

CROSS-REFERENCE TO RELATED APPLICATION

This application claims the benefit of Korean Patent Application No. 10-2007-0093663, filed on Sep. 14, 2007, in the Korean Intellectual Property Office, the entire disclosure of which is incorporated herein by reference.

TECHNICAL FIELD

The present invention relates to a reconfigurable processor (RP) architecture, and more particularly, to a RP architecture using a coarse grained array (CGA).

BACKGROUND

In a conventional art, a device for executing any operation has been embodied using hardware or software. For example, when a network controller for executing a network interface is embodied on a computer chip, the network controller executes only a network interface function defined when fabricated in a factory. It may not be possible for the network interface function to be changed after the network controller is fabricated in the factory. This is an example in the case of using the hardware. Alternatively, there is the case of using software. For example, a program capable of executing desired functions is programmed and the program is executed in a general purpose processor, so that purposes of a user are satisfied. In the case of using the software, it is possible to execute new functions by modifying the software even after the hardware is fabricated in the factory. In the case of using the software, diverse functions can be executed using a given hardware, however, there arises a problem in that a speed is relatively slower than that in the case of using the hardware.

In order to overcome problems occurring in the case of the software and hardware, a reconfigurable processor (RP) architecture has been suggested. The RP architecture may be customized in order to overcome a problem even after a device is fabricated, and a calculation, which is spatially customized in order to execute the calculation, may be used.

The RP architecture may be embodied using a processor core and a coarse grained array (CGA), which are able to execute a plurality of instructions in parallel.

In the present specification, a method of simulating power and a power simulator, which are applicable to the RP architecture including the CGA, are disclosed.

SUMMARY

In one general aspect, a method of simulating power which maintains accuracy of simulation while reducing a time required for the simulation is provided.

In another general aspect, a method of simulating power which is applicable to a reconfigurable processor (RP) including a coarse grained array (CGA) is provided.

In still another general aspect, a power simulator includes a static information extracting unit that extracts static information with respect to execution of the second instruction; a dynamic information extracting unit that extracts dynamic information with respect to the execution of the second instruction; and a calculation unit that calculates an estimated power of the processor based on the static information and the dynamic information.

In yet another general aspect, a method of simulating power includes extracting static information with respect to execution of the second instruction; extracting dynamic information with respect to the execution of the second instruction; and calculating an estimated power of the processor based on the static information and the dynamic information.

BRIEF DESCRIPTION OF THE DRAWINGS

The above and other aspects and/or features will become apparent and more readily appreciated from the following detailed description of certain exemplary embodiments of the invention, taken in conjunction with the accompanying drawings of which:

FIG. 10 is a flowchart illustrating an exemplary method of simulating power.

DETAILED DESCRIPTION

Figure 1:
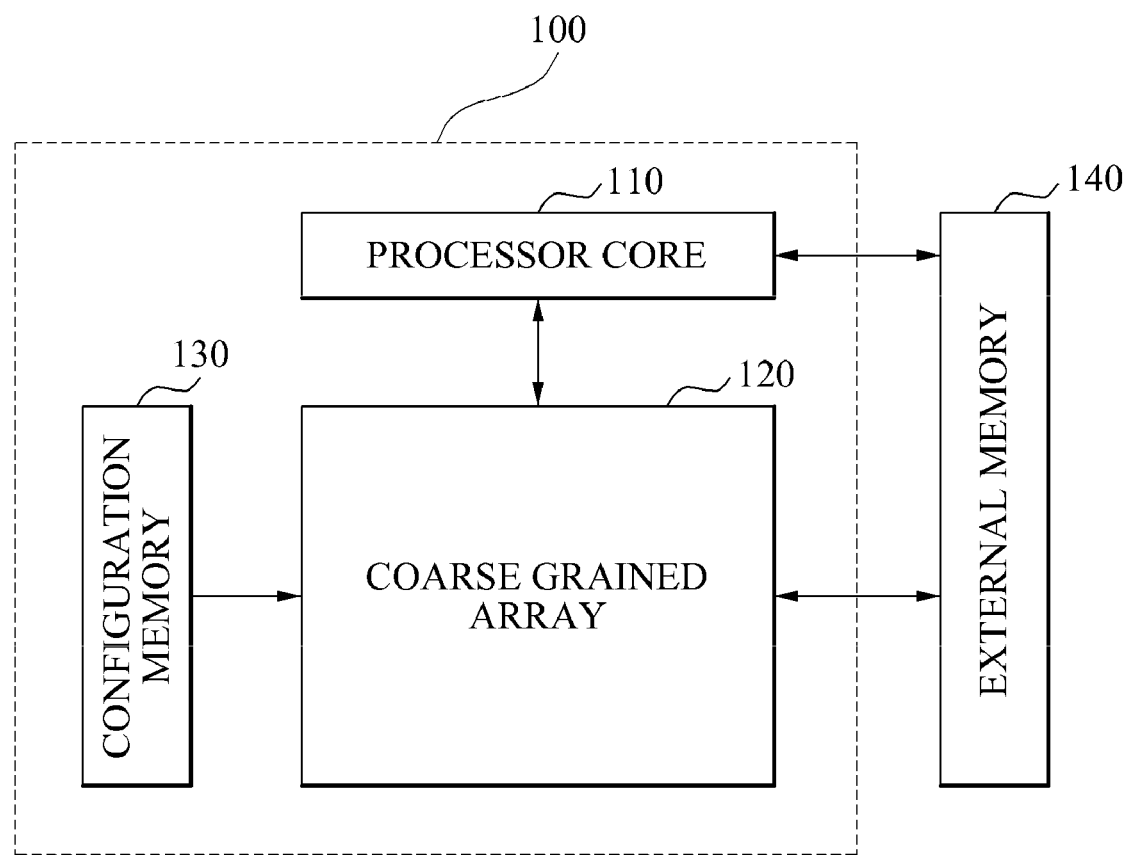
FIG. 1 is a diagram illustrating an exemplary processor in which an exemplary method of simulating power is applied.

Reference will now be made in detail to exemplary embodiments described herein, examples of which are illustrated in the accompanying drawings, wherein like reference numerals refer to the like elements throughout. The exemplary embodiments are described below with reference to the figures.

FIG. 1 illustrates a processor in which an exemplary method of simulating power is applied.

Referring to FIG. 1, a processor 100 includes a processor core 110, a coarse grained array (CGA) 120, and a configuration memory 130, and is connected with an external memory 140.

The processor 100 may determine whether an instruction to be executed is a first instruction or a second instruction according to the characteristic of the instruction to be executed.

Where the instruction to be executed is the first instruction, the processor 100 starts a first active mode.

Where the instruction to be executed is the second instruction, the processor 100 starts a second active mode.

The processor core 110 executes the first instruction while the first active mode is set.

The CGA 120 is suspended while the first active mode is set.

The CGA 120 executes the second instruction while the second active mode is set.

The processor core 110 is suspended while the second active mode is set.

The CGA 120 receives configuration information from the configuration memory 130 while the second active mode is set.

The configuration memory 130 stores the received configuration information of the CGA 120. The CGA 120 receives the configuration information from the configuration memory 130, and executes the second instruction using the received configuration information.

Figure 2:
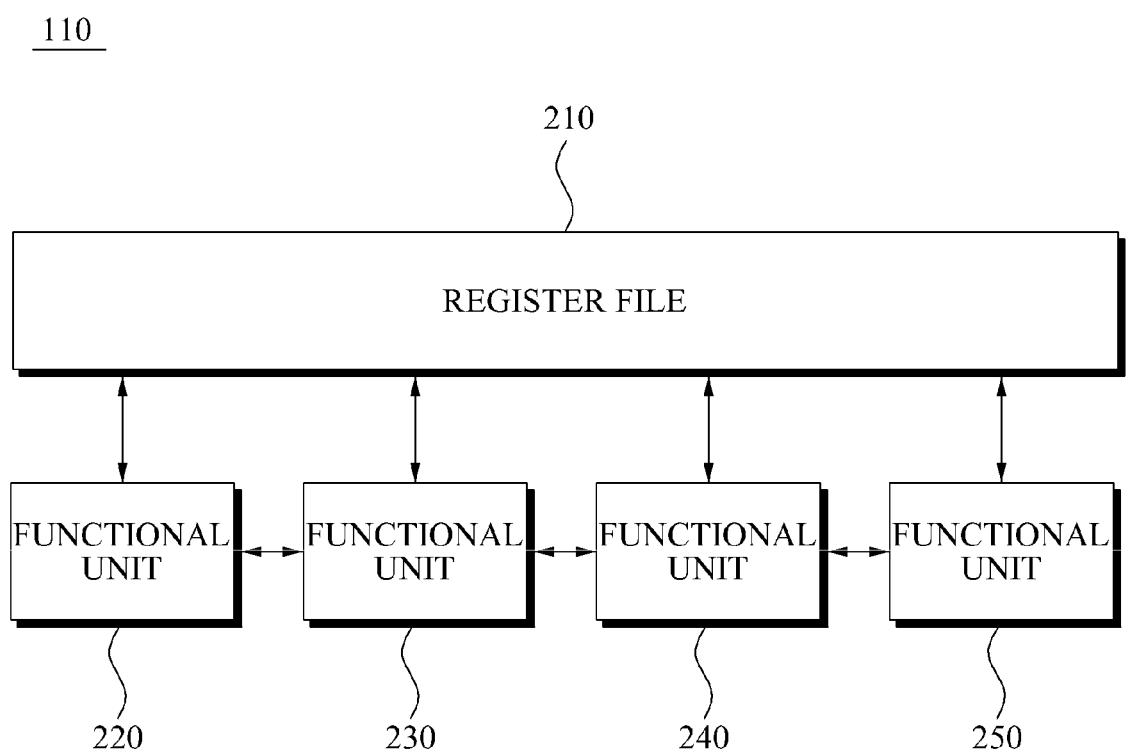
FIG. 2 is a diagram illustrating an exemplary processor core of FIG. 1.

FIG. 2 illustrates the exemplary processor core 100 of FIG. 1.

Referring to FIG. 2, the processor core 110 includes a register file 210, and functional units 220, 230, 240, and 250.

The functional unit 220 executes the first instruction while the first active mode is set, and stores an operation result of the executed first instruction in the register file 210. The functional unit 220 may transmit the operation result to the functional unit 230.

The first instruction may include four instructions executed for a single clock period.

A respective instruction from among the four instructions to be assigned to each respective functional units 220, 230, 240, and 250 may be determined by scheduling of a compiler.

By scheduling, the compiler may determine which instruction from among the four instructions is assigned to each of the functional units 220, 230, 240, and 250 considering characteristics of each of the functional units 220, 230, 240, and 250.

The register file 210 stores operation results of the instructions executed by the functional units 220, 230, 240, and 250.

The processor core 110 may execute a maximum of four instructions in parallel for a single clock period using the four functional units 220, 230, 240, and 250.

According to another exemplary embodiment, the processor core 110 may have a very long instruction word (VLIW) structure.

Figure 3:
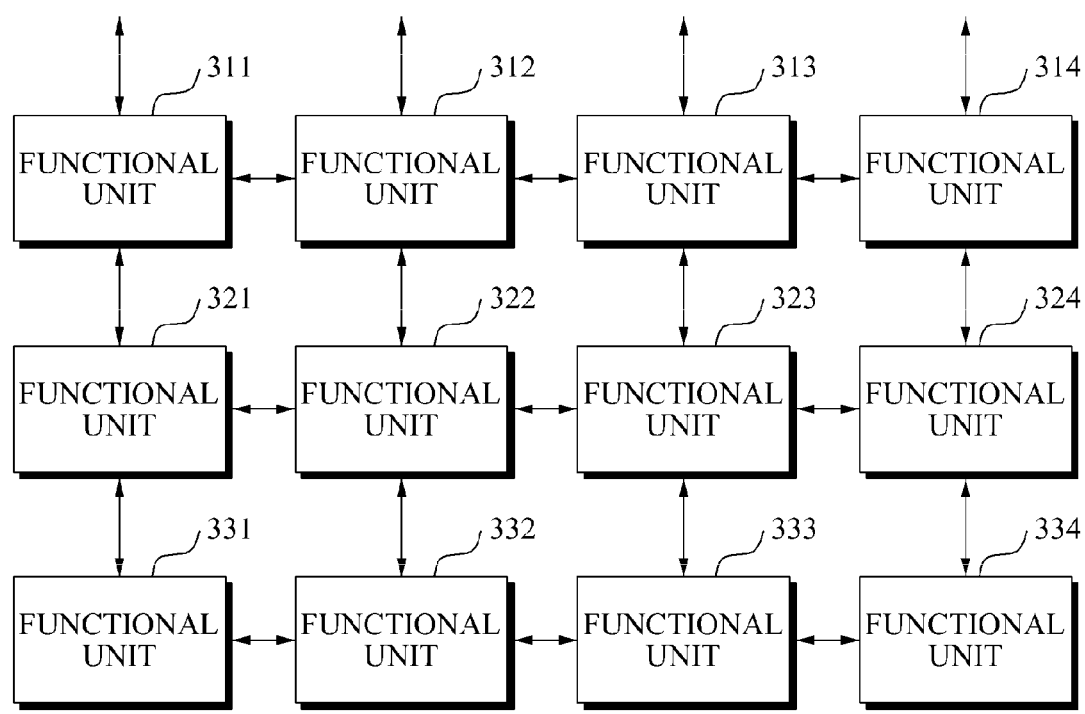
FIG. 3 is a diagram illustrating an exemplary coarse grained array (CGA) of FIG. 1.

FIG. 3 illustrates the exemplary CGA 120 of FIG. 1.

Referring to FIG. 3, the CGA 120 includes twelve functional units 311, 312, 313 314, 321, 322, 323, 324, 331, 332, 333, and 334.

The functional unit 311 may transmit operation results obtained by executing instructions either to the processor core 110, or the functional unit 312 or the functional unit 321.

The functional unit 321 may execute another instruction using operation results obtained by the functional unit 311 executing an instruction.

Configuration information with respect to connection relations between the functional units 311, 312, 313, 314, 321, 322, 323, 324, 331, 332, 333, and 334 within the CGA 120 is stored in the configuration memory 130.

Figure 4:
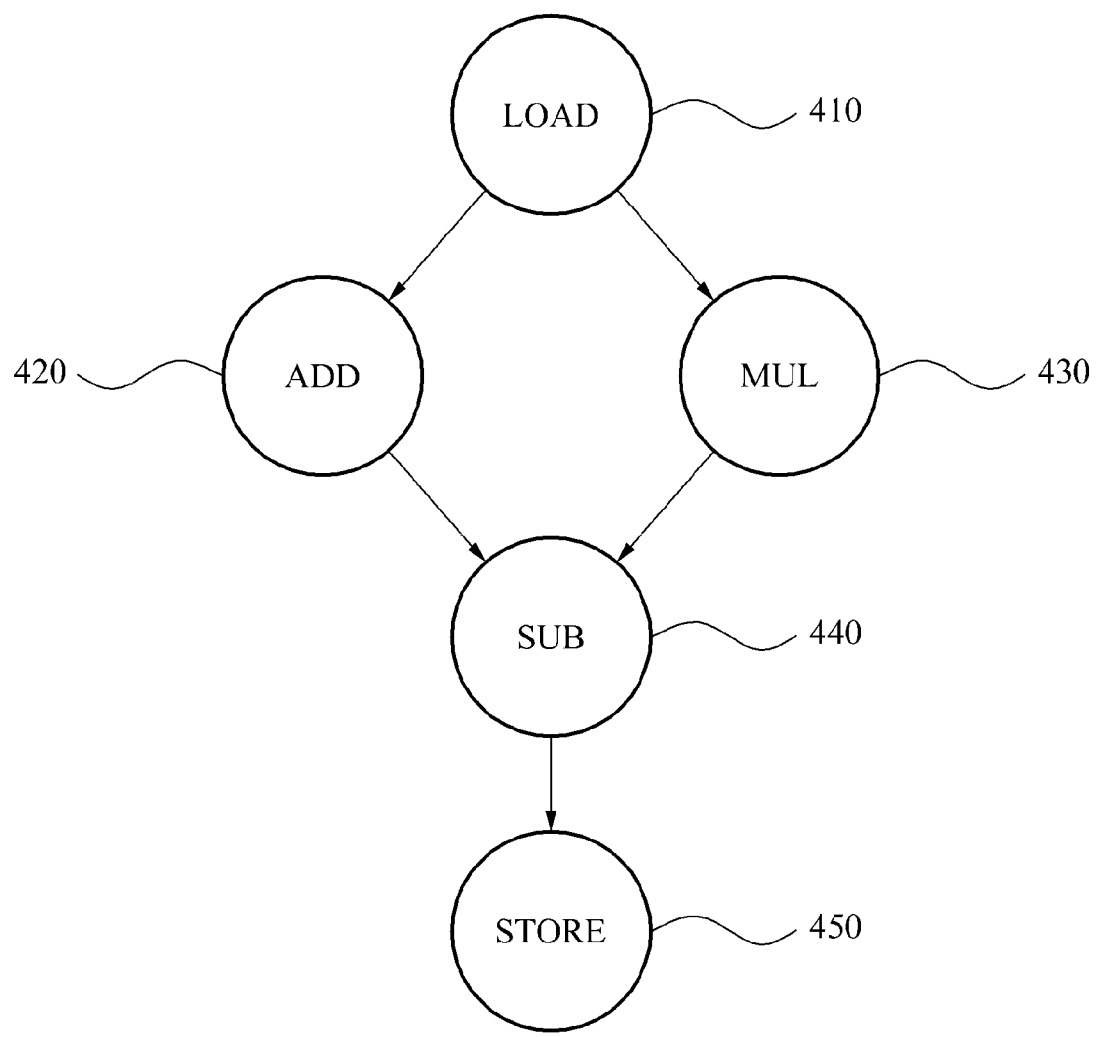
FIG. 4 is a diagram illustrating dependency between instructions used in an exemplary method of simulating power.

FIG. 4 illustrates dependency between instructions used in an exemplary method of simulating power.

Referring to FIG. 4, a load instruction 410 is executed, and then either an add instruction 420 or a multiply instruction 430 is executed. Based on information loaded by the load instruction 410, either the add instruction 420 or multiply instruction 430 is executed.

After either the add instruction 420 or multiply instruction 430 is executed, a subtract instruction 440 is executed. Based on the results of executing the add instruction 420 or the multiply instruction 430, the subtract instruction 440 is executed.

After the subtract instruction 440 is executed, a store instruction 450 is executed. The store instruction 450 stores results of the executed subtract instruction 440.

Figure 5:
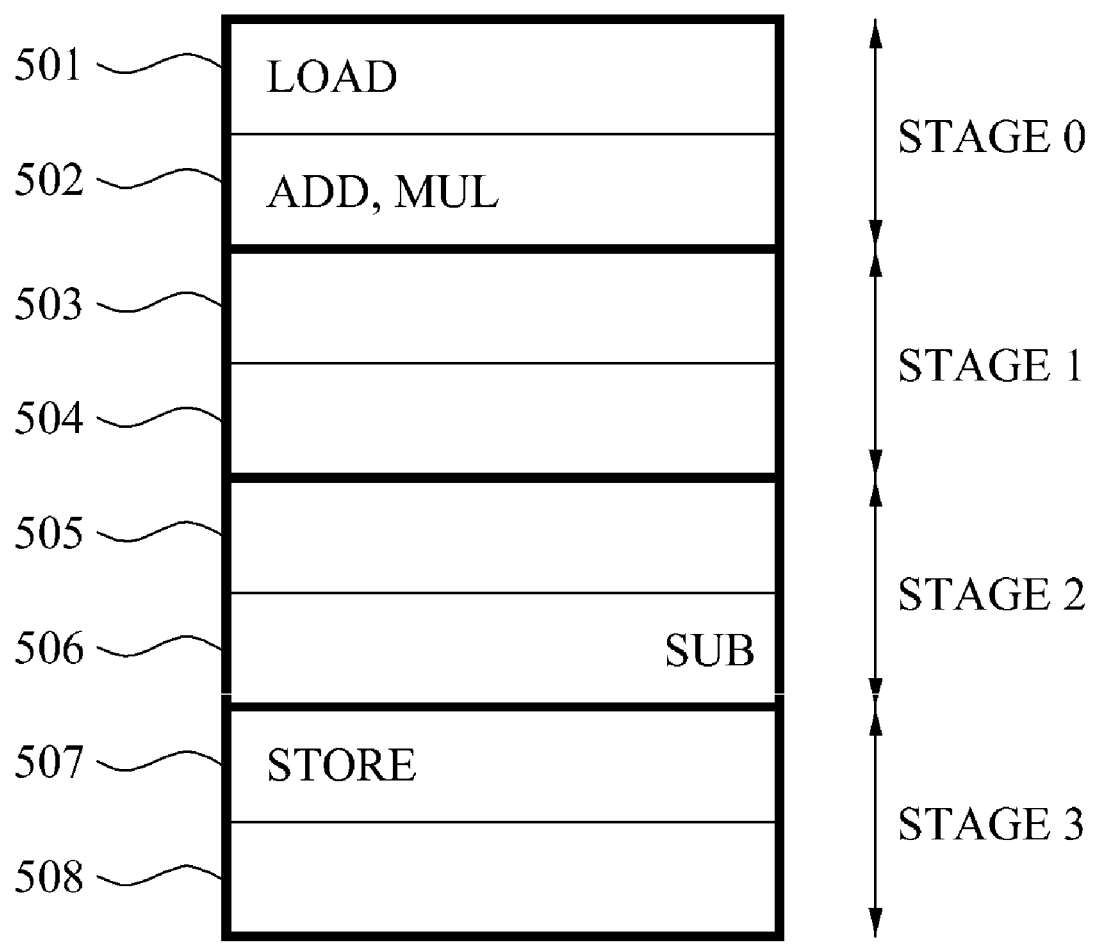
FIG. 5 is a diagram illustrating scheduling results of a compiler used in an exemplary method of simulating power.

FIG. 5 illustrates scheduling results of a compiler used in an exemplary method of simulating power.

Referring to FIG. 5, a load instruction is scheduled during a first time interval 501.

The compiler schedules mutually associated instructions based on the dependency between instructions shown in FIG. 4.

In this instance, a group of the mutually associated instructions are referred to as a thread or a task.

FIG. 5 illustrates scheduled results of instructions included in one thread.

An add instruction and a multiply instruction from among instructions included in the thread are scheduled during a second time interval 502.

The first time interval 501 and the second time interval 502 compose stage 0.

The third time interval 503 and the fourth time interval 504 compose stage 1.

The fifth time interval 505 and the sixth time interval 506 compose stage 2.

The seventh time interval 507 and the eighth time interval 508 compose stage 3.

Stage 0 and stage 3 shown in FIG. 5 denote a single pipeline stage, respectively.

The compiler schedules instructions based on configuration information of the processor core 110 and the CGA 120 other than the dependency between instructions.

No instruction from among instructions included in the thread is scheduled during a third time interval 503, fourth time interval 504, and fifth time interval 505.

A subtract instruction from among instructions included in the thread is scheduled during a sixth time interval 506.

A store instruction from among instructions included in the thread is scheduled during a seventh time interval 507.

No instruction from among instructions included in the thread is scheduled during an eighth time interval 508.

A plurality of threads is assigned in the processor core 110 or the CGA 120 for each pipe stage.

Figure 6:
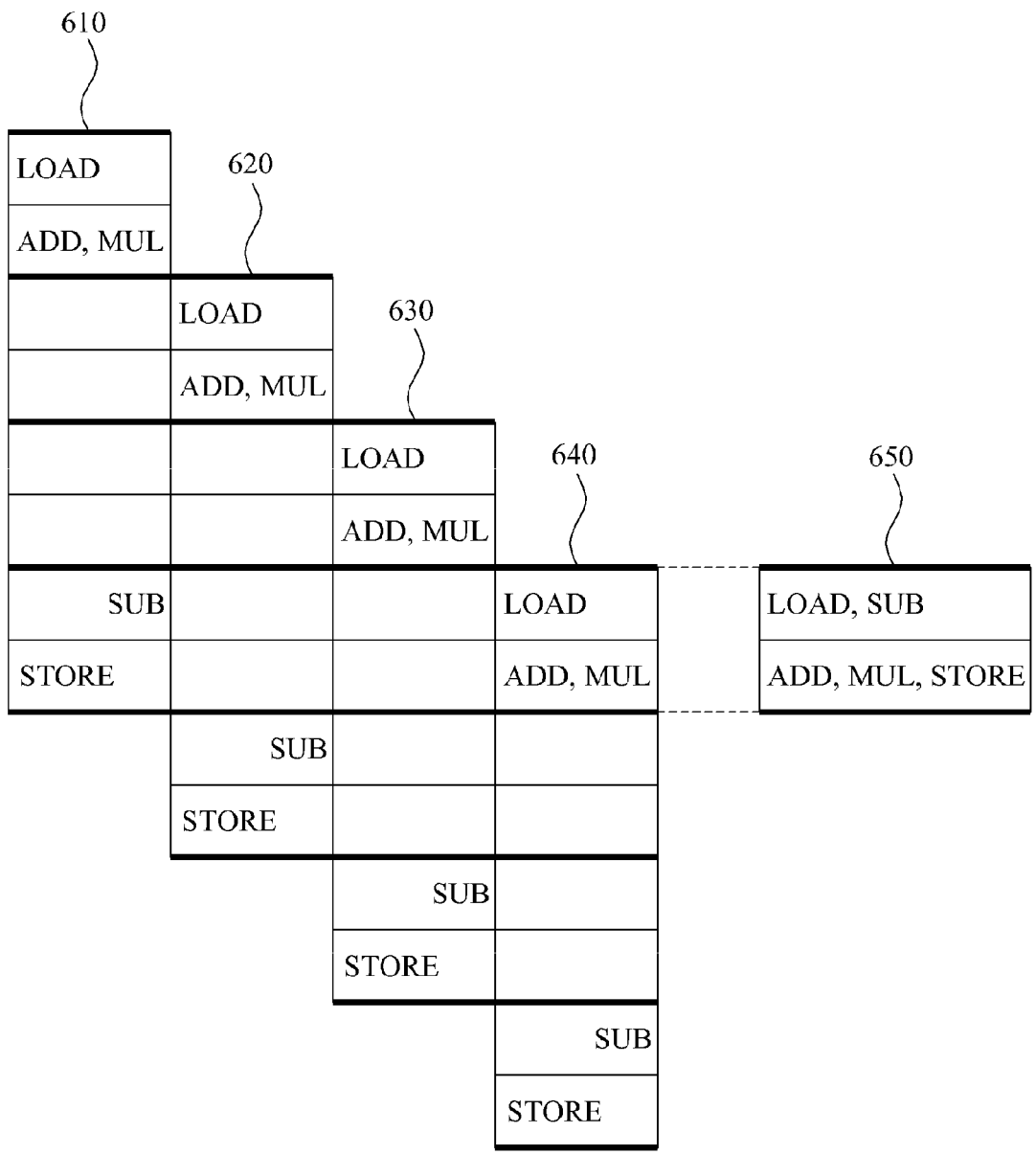
FIG. 6 is a diagram illustrating a process for extracting static information in an exemplary method of simulating power.

FIG. 6 illustrates a process for extracting static information in an exemplary method of simulating power.

Referring to FIG. 6, a thread 610 is executed in the CGA 120 starting from a first time interval.

The compiler schedules instructions included in the thread 610.

A load instruction of the thread 610 is executed during the first time interval, and an add instruction and multiply instruction of the thread 610 are executed during the second time interval.

A thread 620 is executed in the CGA 120 starting from a third time interval.

Since the first time interval and the second time interval compose a single pipeline stage, the thread 620 is executed starting from the third time interval.

A load instruction of the thread 620 is executed during the third time interval, and an add instruction and multiply instruction of the thread 620 are executed during a fourth time interval.

A thread 630 is executed in the CGA 120 starting from a fifth time interval.

A load instruction of the thread 630 is executed during the fifth time interval, and an add instruction and multiply instruction of the thread 630 are executed during a sixth time interval.

A thread 640 is executed in the CGA 120 starting from a seventh time interval.

A load instruction of the thread 640 is executed during the seventh time interval, and an add instruction and multiply instruction of the thread 640 are executed during an eighth time interval.

A subtract instruction of the thread 610 is executed in the CGA 120 during the seventh time interval. Also, a store instruction of the thread 610 is executed in the CGA 120 during the eighth time interval.

Where a loop formed by threads with identical types is repeatedly executed to thereby reach a steady state, a number of instructions executed in the CGA 120 during a single time interval is identical.

For example, as shown in FIG. 6, the subtract instruction of the thread 610 and the load instruction of the thread 640 are executed during the seventh time interval. Where threads are repeatedly executed by a pipeline scheme to thereby reach a steady state, a subtract instruction and a load instruction are executed during odd time intervals.

The store instruction of the thread 610 and the add instruction and multiply instruction of the thread 640 are respectively executed during the eighth time interval. In the steady state, a store instruction, add instruction, and multiply instruction are respectively executed during even time intervals.

Instructions executed in a single stage in the case of the steady state are illustrated at a stage 650.

The method of simulating power may determine five instructions are executed in a single stage, where the CGA 120 passes through a prologue step to thereby reach the steady state. The method of simulating power may determine a number and type of instructions executed for each stage, and generate static information based on the determined number and type of instructions.

According to another exemplary embodiment, the method of simulating power may determine a number and types of instructions executed for each time interval, and generate static information based on the determined number and type of instruction.

Figure 7:
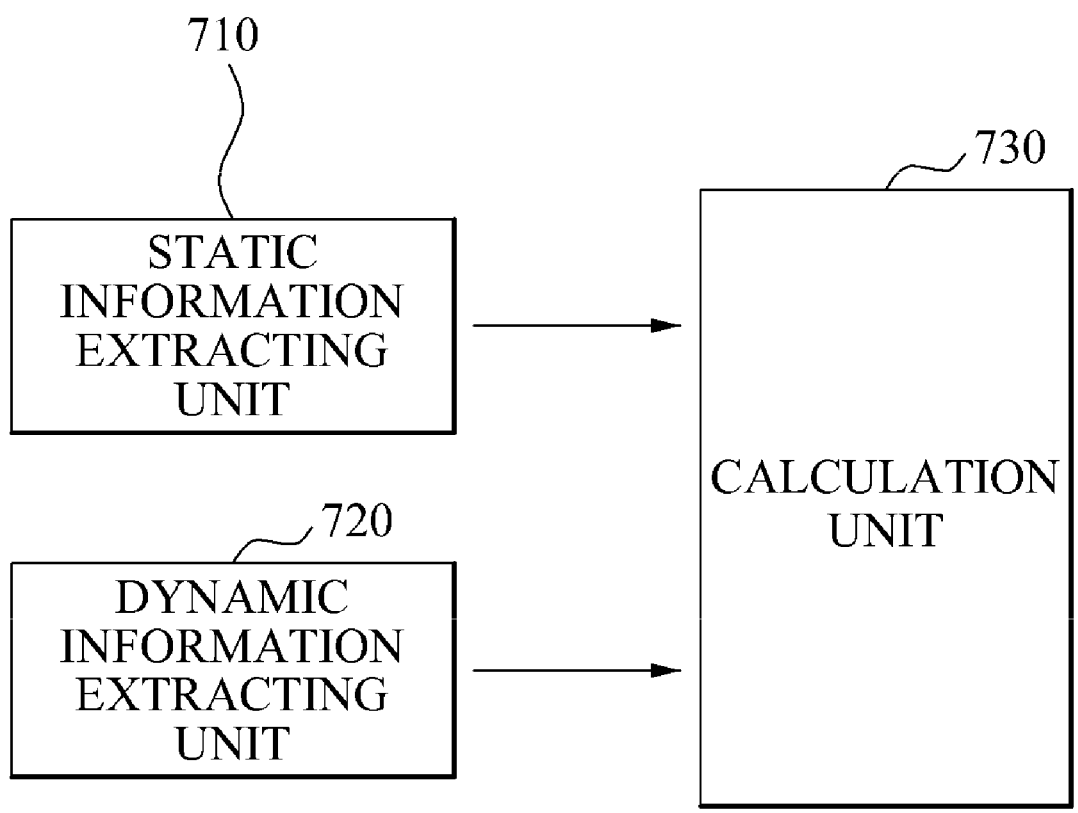
FIG. 7 is a diagram illustrating an exemplary power simulator.

FIG. 7 illustrates an exemplary power simulator.

Referring to FIG. 7, a power simulator 700 includes a static information extracting unit 710, a dynamic information extracting unit 720, and a calculation unit 730.

The static information extracting unit 710 extracts static information with respect to execution of a second instruction executed in the CGA 120.

The static information extracting unit 710 extracts the static information by a scheduling process of a compiler.

The static information extracting unit 710 extracts the static information based on configuration information of the CGA 120.

The configuration information includes power consumption information of functional units within the CGA 120.

Specifically, the configuration information may include information about an amount of power consumption required when an instruction is executed in each functional unit.

The configuration memory 130 stores the configuration information, and the static information extracting unit 710 receives the configuration information from the configuration memory 130.

The dynamic information extracting unit 720 extracts dynamic information with respect to the execution of the second instruction executed in the CGA 120.

The dynamic information extracting unit 720 extracts the dynamic information by an instruction level simulation.

The instruction level simulation is performed such that executed results of each instruction are logically traced and simulated. The instruction level simulation has a relatively shorter time required for simulation, however, has less accuracy of a calculated estimated power in comparison with a time level simulation.

The static information extracting unit 720 analyzes instructions assigned to functional units within the CGA 120 to extract the dynamic information.

The static information includes a number of times the instruction assigned to each of the functional units within the CGA 120 is executed.

The static information provides information about a code mapped in the CGA 120 or execution of instructions.

The static information extracting unit 720 analyzes activities of the functional units within the CGA to extract the dynamic information.

The CGA 120 may include a register file and a multiplexer (MUX) other than the functional units. In this instance, the static information extracting unit 720 acquires information about activities of the register file and the MUX as well as the functional units to thereby extract the dynamic information.

The calculation unit 730 calculates an estimated power of the processor 100 based on the static information and the dynamic information.

The calculation unit 730 reflects characteristics of a process where the processor 100 is embodied to thereby calculate the estimated power of the processor 100.

The estimated power may be represented by:

$$P_{dynamic} = aCV_{DD}^2 f, \quad \text{[Equation 1]}$$

where '$P_{dynamic}$' denotes an estimated power, 'a' denotes a switching activity factor, 'C' denotes a total of a load capacitance charged or discharged in a switching operation, 'f' denotes an operation frequency of the processor 100, and '$V_{DD}$' denotes a supplied source voltage supplied to the processor 100.

Figure 8:
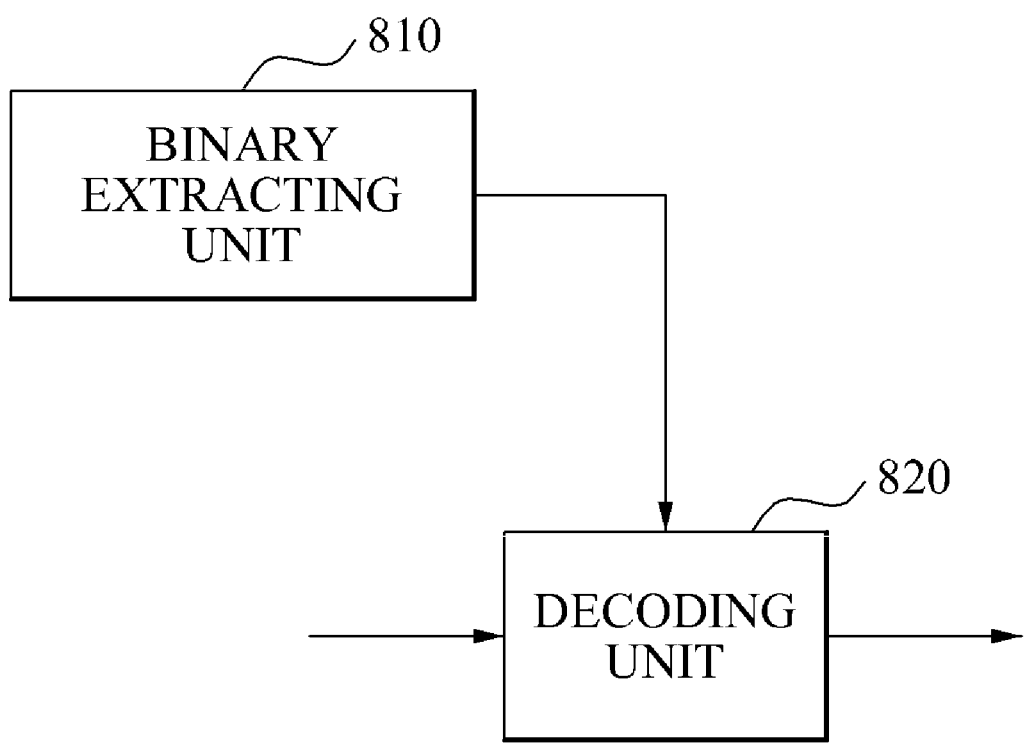
FIG. 8 is a diagram illustrating an exemplary static information extracting unit of FIG. 7.

FIG. 8 illustrates the exemplary static information extracting unit 710 of FIG. 7.

Referring to FIG. 8, the static information extracting unit 710 includes a binary extracting unit 810 and a decoding unit 820.

The binary extracting unit 810 extracts configuration binary (or configuration binary information).

The decoding unit 820 decodes the configuration binary information using configuration layout information. The decoding unit 820 generates decodes the configuration binary information to generate the static information.

According to another exemplary embodiment, the configuration binary information may include information with respect to each connection relation between the functional units of the CGA 120.

The configuration layout information may include information for decoding the configuration binary information.

The static information may be generated based on architecture description information.

The architecture description information is information for describing an array architecture of the CGA 120, and provides information about each power element consuming power while an instruction is being executed.

The power simulator 700 may be embodied via hardware or software. In the case of the hardware embodiment, the power simulator 700 may be embodied as a system using a semiconductor integrated circuit or an electronic circuit.

In the case of the software embodiment, the power simulator 700 may be embodied such that each of components of the power simulator 700 is independently performed as a single module, or such that a single module performs multi-functionalities of the components.

In an exemplary embodiment described above, the CGA 120 instead of the processor core 110 executes the second instruction. However, it is understood that embodiments are not limited thereto. The processor core 110 is not limited to the above-described VLIW processor, and may be a processor having a Reduced Instruction Set Computer (RISC) structure, and the like.

The power simulator 700 may be applied to a processor which includes a functional unit having either a similar structure as in the CGA 120 or an array structure where components are repeatedly arranged.

The power simulator 700 may be applied to a circuit including several hundred or thousand components which are repeatedly arranged, such as a display driver circuit.

Conventional method of simulating power or power simulator may have relatively greater time requirements when calculating an estimated power of a processor including an array structure. It is believed that this is because a number of overall components is significantly greater due to the array structure.

The exemplary power simulator 700 classifies information required for calculating the estimated power into static information and dynamic information to thereby acquire each information using a separate process.

The static information is generated based on information with respect to a scheduling process of a compiler and connection relations between components of the power simulator 700. Where a loop is executed in the array structure, static information about power consumed during a unit time period is acquired from the static information.

The dynamic information is acquired from a simulation at instruction level.

The dynamic information includes information about a number of times each type of instructions is executed where the loop is executed.

The power simulator 700 acquires a significantly similar value as that of the estimated power calculated in a conventional time level simulation process.

The power simulator 700 may provide a significantly similar calculation result in comparison with a conventional time level simulator, while remarkably reducing the simulation time.

As shown in FIG. 6, a loop instruction is statically scheduled, the power simulator 700 may acquire information about a number of times the loop instruction is mapped in each of the functional units of the CGA 120. The number of times the loop instruction is mapped in each of the functional units while a single loop instruction is being executed may be referred to as a loop count. The loop count is representative static information acquired by power simulator 700 of the present invention.

Where the loop instruction is mapped, information about a number of times instructions within a loop are executed may be acquired from the simulation of the instruction level. The number of times the instructions within the loop are executed while a workload is being executed may be referred to as an iteration count. The iteration count is representative dynamic information acquired by the power simulator 700 of the present invention.

The power simulator 700 may obtain a loop count and an iteration count with respect to each of the functional units of the CGA 120, and then multiply the loop count by the iteration count to thereby obtain a switching activity factor with respect to each of the functional units.

Each of the functional units is a power element consuming power. Information about how much power each of the power elements is consuming is provided as static information.

The power simulator 700 may calculate an estimated power of each of the power elements by obtaining consumption power information and the switching activity factor with respect to each of the power elements. The power simulator 700 may sum all calculated consumption power with respect to each of the power elements to thereby obtain a total consumption power.

Figure 9:
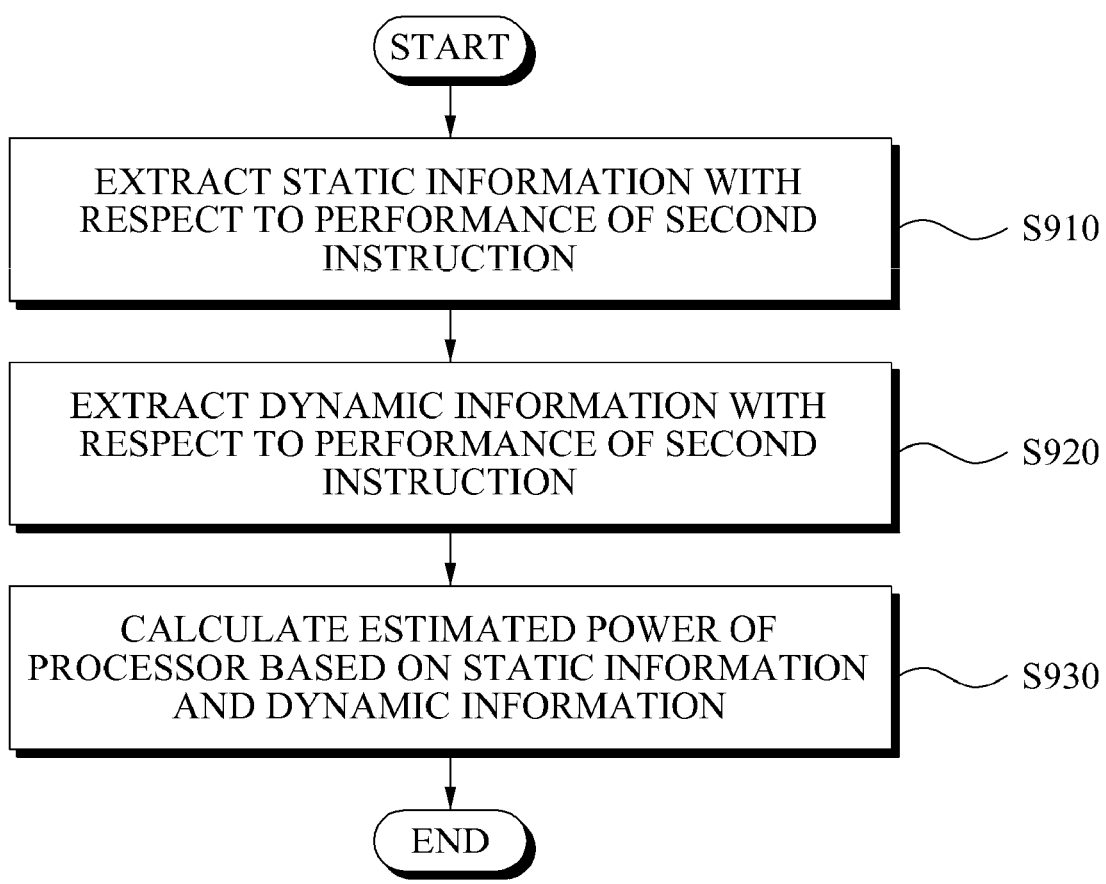
FIG. 9 is a flowchart illustrating an exemplary method of simulating power.

FIG. 9 illustrates an exemplary method of simulating power. Referring to FIG. 9, in operation S910, the method of simulating power extracts static information with respect to execution of a second instruction. In operation S920, the method of simulating power extracts dynamic information with respect to execution of the second instruction. In operation S930, the method of simulating power calculates an estimated power of the processor 100 based on the static information and the dynamic information.

FIG. 10 illustrates another exemplary method of simulating power. Referring to FIG. 10, in operation S1010, the method of simulating power extracts technology (or manufacturing process) dependent information.

In operation S1080, the method of simulating power calculates an estimated power using the technology dependent information. The technology dependent information includes information about characteristics of a manufacturing process of semiconductor where the processor 100 is embodied.

In operation S1020, the method of simulating power extracts configuration information of the CGA 120. The configuration information includes power consumption information of functional units within the CGA 120.

In operation S1030, the method of simulating power executes a scheduling of the compiler. The method of simulating power extracts configuration binary information using the scheduling of the compiler.

In operation S1040, the method of simulating power decodes the configuration binary information. The method of simulating power decodes the configuration binary information using configuration layout information.

In operation S1050, the method of simulating power executes an instruction level simulation.

In operation S1060, the method of simulating power extracts dynamic information using results of the instruction level simulation.

According to another exemplary embodiment, the method of simulating power may analyze instructions assigned to functional units within the CGA 120 to thereby extract dynamic information.

In operation S1070, the method of simulating power extracts activity information of each of the functional units within the CGA 120 based on the configuration information, the decoded configuration binary information, and the dynamic information of the CGA 120.

In operation S1080, the method of simulating power calculates an estimated power based on the activity information and the technology dependency information.

The method of simulating power according to the above-described exemplary embodiments may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like.

Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention.

Although a few exemplary embodiments have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A power simulator in a processor, comprising:
a processor core performing a first instruction;
a coarse grained array (CGA) performing a second instruction;
a static information extracting unit that extracts static information with respect to execution of the second instruction;
a dynamic information extracting unit that extracts dynamic information with respect to the execution of the second instruction; and
a calculation unit that calculates an estimated power of the processor based on the static information and the dynamic information,
wherein the static information extracting unit extracts the static information based on configuration information including power consumption information of functional units within the CGA.

2. The power simulator of claim 1, wherein the static information extracting unit extracts the static information by a scheduling process of a compiler.

3. The power simulator of claim 1, wherein the static information extracting unit includes:
a binary extracting unit that extracts configuration binary information; and
a decoding unit that decodes the configuration binary information using configuration layout information to generate the static information.

4. The power simulator of claim 1, wherein the configuration information comprises an amount of power consumption required when an instruction is executed in a functional unit.

5. The power simulator of claim 1, wherein the dynamic information extracting unit extracts the dynamic information by an instruction level simulation.

6. The power simulator of claim 1, wherein the dynamic information extracting unit analyzes instructions assigned to the functional units within the CGA to extract the dynamic information.

7. The power simulator of claim 1, wherein the dynamic information extracting unit analyzes activities of the functional units within the CGA to extract the dynamic information.

8. The power simulator of claim 1, wherein the calculation unit reflects characteristics of a process where the processor is embodied to thereby calculate the estimated power of the processor.

9. The power simulator of claim 1, wherein:
the static information extracting unit extracts loop count information as the static information by a scheduling process of a compiler,
the dynamic information extracting unit extracts iteration count information as the dynamic information by an instruction level simulation,
the calculation unit multiplies power consumption information of each functional unit within the CGA, the loop count information, and the iteration count information so as to calculate power consumption of each of the functional units, and
the calculation unit adds the calculated power consumption of each of the functional units together so as to calculate a total power consumption.

10. A method of simulating power in a processor, comprising:
performing a first instruction in the processor core; and
performing a second instruction in a coarse grained array (CGA);
extracting static information with respect to execution of the second instruction;
extracting dynamic information with respect to the execution of the second instruction; and
calculating an estimated power of the processor based on the static information and the dynamic information,
wherein the extracting of the static information comprises extracting the static information based on configuration information including power consumption information of functional units within the CGA.

11. The method of simulating power of claim 10, wherein the extracting of the static information comprises extracting the static information by a scheduling process of a compiler.

12. The method of simulating power of claim 10, wherein the extracting of the static information comprises:
extracting configuration binary information; and
decoding the configuration binary information using configuration layout information, and
generating the static information.

13. The method of simulating power of claim 10, wherein the configuration information comprises an amount of power consumption required when an instruction is executed in a functional unit.

14. The method of simulating power of claim 10, wherein the extracting of the dynamic information comprises extracting the dynamic information by an instruction level simulation.

15. The method of simulating power of claim 10, wherein the extracting of the dynamic information comprises analyzing instructions assigned to the functional units within the CGA to extract the dynamic information.

16. The method of simulating power of claim 10, wherein the extracting of the dynamic information comprises analyzing activities of the functional units within the CGA to extract the dynamic information.

17. The method of simulating power of claim 10, wherein the calculating is based on characteristics of a process where the processor is embodied to thereby estimate power of the processor.

18. A non-transitory computer-readable recording medium storing a program for implementing the method of claim 10.

* * * * *